United States Patent
Agarwal et al.

(10) Patent No.: US 10,288,653 B2
(45) Date of Patent: May 14, 2019

(54) TIME SERIES ANALYTICS

(71) Applicant: TATA CONSULTANCY SERVICES LIMITED, Mumbai, Maharashtra (IN)

(72) Inventors: Puneet Agarwal, Maharashtra (IN); Gautam Shroff, Haryana (IN); Rishabh Gupta, Uttar Pradesh (IN)

(73) Assignee: TATA CONSULTANCY SERVICES LIMITED, Mumbai (IN)

( * ) Notice: Subject to any disclaimer, the term of this patent is extended or adjusted under 35 U.S.C. 154(b) by 1150 days.

(21) Appl. No.: 14/538,999

(22) Filed: Nov. 12, 2014

(65) Prior Publication Data

US 2015/0253366 A1    Sep. 10, 2015

(30) Foreign Application Priority Data

Mar. 6, 2014  (IN) ........................... 772/MUM/2014

(51) Int. Cl.
*G01R 13/00* (2006.01)
*G06K 9/00* (2006.01)
(Continued)

(52) U.S. Cl.
CPC ........... *G01R 23/005* (2013.01); *G01R 13/00* (2013.01); *G06K 9/00536* (2013.01); *G06K 9/6218* (2013.01)

(58) Field of Classification Search
CPC ........... G06K 9/00496; G06K 9/00536; G06K 9/0055
See application file for complete search history.

(56) References Cited

U.S. PATENT DOCUMENTS 8,630,967 B2 *  1/2014  Sharma .............. H05K 7/20836
                                                          706/26
8,880,441 B1 *  11/2014  Chen ...................... G06F 15/18
                                                          706/12
(Continued)

FOREIGN PATENT DOCUMENTS

CA    2741202 A1    11/2012

OTHER PUBLICATIONS

Hill et al., "Spherical k-means clustering is good for interpreting multivariate species occurrence data", Methods in Ecology and Evolution, Dec. 2013, vol. 4, pp. 542-551.*

(Continued)

*Primary Examiner* — Whitney Moore
(74) *Attorney, Agent, or Firm* — Lee & Hayes, P.C.

(57) ABSTRACT

A method for identifying frequently occurring waveform patterns in time series comprises segmenting each of one or more time series into a plurality of subsequences. Further, a subsequence matrix comprising each of the plurality of subsequences is generated. Further, the subsequence matrix is processed to obtain a candidate subsequence matrix comprising a plurality of non-trivial subsequences. Further, the plurality of non-trivial subsequences is clustered into a plurality of spherical clusters of a predetermined diameter. Further, a plurality of sub-clusters for each of one or more spherical clusters is obtained based on a mean of each of the plurality of non-trivial subsequences present in the spherical cluster. Further, one or more frequent waveform clusters, depicting frequently occurring waveform patterns, are ascertained from amongst the one or more spherical clusters based on a number of non-trivial subsequences present in each of the plurality of sub-clusters of the spherical cluster.

16 Claims, 2 Drawing Sheets

(51) Int. Cl.
*G01R 23/00* (2006.01)
*G06K 9/62* (2006.01)

(56) References Cited

U.S. PATENT DOCUMENTS

| | | | | |
|---|---|---|---|---|
| 8,972,308 | B2* | 3/2015 | Hao | G06F 17/00 706/12 |
| 2004/0024773 | A1* | 2/2004 | Stoffel | G06K 9/6282 |
| 2008/0319951 | A1* | 12/2008 | Ueno | G06F 17/30598 |
| 2013/0085405 | A1* | 4/2013 | Bera | A61B 5/044 600/515 |
| 2014/0039274 | A1* | 2/2014 | Sarrafzadeh | A61B 5/1118 600/300 |
| 2014/0296724 | A1* | 10/2014 | Guttag | A61B 5/02405 600/509 |
| 2014/0358465 | A1* | 12/2014 | Shin | H01L 22/20 702/82 |
| 2014/0358487 | A1* | 12/2014 | Shin | G05B 23/0221 702/190 |
| 2014/0372813 | A1* | 12/2014 | Shin | G06F 11/076 714/704 |
| 2015/0178286 | A1* | 6/2015 | Dhollander | G06F 17/3053 707/728 |
| 2016/0078027 | A1* | 3/2016 | Katsuki | G06F 17/27 707/693 |
| 2016/0140208 | A1* | 5/2016 | Dang | G06F 17/30943 707/737 |
| 2016/0371588 | A1* | 12/2016 | Richardson | G06N 99/005 |

OTHER PUBLICATIONS

Barton, "Cluster analysis of time series data", Presentation—Department of Theoretical Computer Science; Faculty of Information Technology; Czech Technical University in Prague, Jan. 5, 2012, 42 pages.*

Lin et al., "Experienccing SAX: a novel symbolic representation of time series", Data Min Knowl Disc (2007), Apr. 3, 2007, 38 pages.*

Keogh et al., "Clustering of time-series subsequences is meaningless: implications for previous and future research", Knowledge and Information Systems, Aug. 31, 2004, pp. 154-177.*

Zhang et al., "A novel clustering method on time series data", Expert Systems with Applications, Mar. 2011, pp. 11891-11900.*

Fu, "A review of time series data mining", Engineering Applications of Artificial Intelligence, Sep. 2010, pp. 164-181.*

Rodpongpun et al., "Selective subsequence Time Series lustering", Knowledge-Based Systems (2012), Apr. 27, 2012, pp. 361-368.*

Liao, "Clustering of time series data—A survey", Pattern Reognition 38 (2005),Jan. 2005, pp. 1857-1874.*

Zhong, "Efficient Online Spherical K-means Clustering", Proceedings of International Joint Conference on Neural Networks, Montreal, Canada, Aug. 2005, 6 pages.*

Peker, "Subsequence Time Series (STS) Clustering Techniques for Meaningful Pattern Discovery", KIMAS 2005 Waltham, MA USA, Apr. 2005, 6 pages.*

Kanungo et al., "An Efficient K-means Clustering Algorithm: Analysis and Implementation", IEEE Transactions on Pattern Analysis and MAchine Intelligence, vol. 24, No. 7, Jul. 2002, pp. 881-892.*

Estivill-Castro, "Why so many clustering algorithms—A Position Paper", SIGKDD Explorations, vol. 1, Issue 1, Jun. 2002, pp. 65-75.*

Muhammad Marwan Muhammad Fuad, Pierre-Francois Marteau. Towards a Faster Symbolic Aggregate Approximation Method. ICSOFT 2010—Fifth International Conference on Software and Data Technologies, Jul. 2010, Athens, Greece. SciTePress, 1, pp. 305-310, 2010.*

Experiencing SAX: a novel symbolic representation of time series Lin, J., Keogh, E., Wei, L. et al. Data Min Knowl Disc (2007) 15: 107. https://doi.org/10.1007/s10618-007-0064-z.*

P. M. Barnaghi, A. Abu Bakar and Z. A. Othman, "Enhanced symbolic aggregate approximation method for financial time series data representation," 2012 6th International Conference on New Trends in Information Science, Service Science and Data Mining (ISSDM2012), Taipei, 2012, pp. 790-795.*

* cited by examiner

TIME SERIES ANALYTICS

TECHNICAL FIELD

The present subject matter relates, in general, to time series analytics and, particularly but not exclusively, to identifying frequently occurring waveform patterns in time series.

BACKGROUND

Data recording devices which include sensors, are widely deployed in several industries, such as automotive industry, stock market industry, electrical industry, and electro-mechanical industry. Such devices typically record data pertaining to an activity or an operation at uniform intervals of time. For example, in stock markets in financial sectors, the data recording device may be deployed for recording the value of a stock through the course of a day. Data recorded by such data recording devices is generally represented in the form of a time series. A time series may be understood as a sequence of values measured typically at successive points in time spaced at uniform time intervals. Further, the data may be subjected to several data analytics techniques for analysis and diagnostic purposes.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Sensors generally sense and record data pertaining to an operation or a system at uniform intervals of time. Such data measured at successive points in time spaced at uniform time intervals, may be represented as a time series, and is referred to as time series data. Typically, a time series represents data pertaining to a single run of the operation or the system and as may be understood, several such time series may be recorded by the sensor during different runs of the operation or the system. For example, a sensor may be deployed for recording data pertaining to different runs of a vehicle in a vehicle testing facility. The time series data recorded by such sensors can be used for further analysis using analytics techniques, such as rule mining, classification, and anomaly detection.

Certain analytics techniques make use of frequently occurring waveform patterns, also referred to as cluster of subsequences or time-series motif, present in a time series for analyzing time series data. A waveform pattern, also known as motif, may be understood as a sequence of values corresponding to a particular state of the operation. For example, a waveform pattern may correspond to or represent different temperature states, such as high temperature and low temperature of a thermostat. Generally, in order to identify frequent motifs present in a time series, time series data pertaining to the time series is initially segmented into a plurality of subsequences. Each of the subsequence in the plurality of subsequences is of a predetermined length. The predetermined length typically corresponds to time duration of an operation or an event for which the frequent motifs are to be identified. The plurality of subsequence is then analyzed for identifying the motifs.

In one conventional method for identifying motifs, each of the plurality of subsequences is compared with the remaining subsequences in the plurality of subsequences. In a case where the subsequence matches any of the remaining subsequences, both the subsequences are paired together. As an outcome of the aforementioned method, pairs of similar or equal subsequences are obtained. For a given set of subsequences comprising n subsequences, the number of operations required to determine all pairs of similar subsequences is of order $n^2$. Further, as the number of subsequences in the set of subsequences increases, the number of operations required for determining pairs of similar subsequences also increase. Thus, for larger time series from which large number of subsequences are obtained, identification of such pairs becomes a computationally intensive task. Further, the conventional method is limited to identification of pairs only. As a result, further analysis involving time consuming complex computations may need to be performed for identification of a group of similar subsequences from the identified pairs of subsequences.

In another technique, the plurality of subsequences is clustered into one or more clusters using various clustering mechanisms. Such clustering mechanisms are typically dependent on size and shape of clusters for clustering the subsequences. In said technique, clusters of similar or matching subsequences are ascertained. Two subsequences are deemed to be similar in a case where a distance between the two subsequences is less than a predetermined distance pertaining to the cluster. As the number of subsequences getting clustered into the cluster increases, the predetermined distance pertaining to the cluster also increases. As a result, a large number of non-similar subsequences may get clustered into the cluster. Thus, said technique may result in generation of clusters of poor quality which in turn may affect the outcome of further analytics being performed using such clusters.

The present subject matter describes a method and a system for identifying frequently occurring waveform patterns in time series. According to an implementation, a plurality of subsequences pertaining to time series data of the time series is clustered into one or more spherical clusters of predetermined diameter. The predetermined diameter of a spherical cluster is obtained by fixing a radius, say R, of the spherical cluster. As a result of fixing the radius, a maximum distance between any two subsequences in the spherical cluster is at most equal to the diameter of the spherical cluster. Fixing of the radius averts the probability of the predetermined diameter increasing with the increase in number of the subsequence being clustered into the cluster. Thus, clustering of subsequences into spherical clusters of predetermined diameter, also referred to as bounded spherical clusters, reduces the probability of a non-similar subsequence getting clustered into spherical cluster.

In an implementation, frequently occurring waveform patterns pertaining to one or more time series are identified. Initially, each time series is segmented to obtain a plurality of subsequences corresponding to the time series. In one example, the time series may be segmented using a moving window of length w such that each subsequence obtained as a result of the segmentation is of length w. For instance, a thousand seconds long time series may be segmented using a moving window of length ten seconds to obtain nine hundred and ninety one subsequences of length ten seconds each. Thereafter, a subsequence matrix comprising the subsequences is generated. The subsequence matrix includes a subsequence in every row and the number of rows in the subsequence matrix is equal to a number of subsequences. For example, in the previous instance where the thousand second long time series was segmented, the subsequence matrix may include nine hundred and ninety one rows, where each row comprises a subsequence.

The subsequences included in the subsequence matrix may then be filtered and normalized. In one example, the subsequences may be filtered using an indicator function ($f( )$). As would be understood, the indicator function may be defined based on a predetermined filtering condition and may be deployed for identifying subsequences satisfying the predetermined filtering condition. The subsequences satisfying the filtering condition are retained for further processing. On the other hand, all subsequences failing to satisfy the predetermined filtering condition are filtered out and are not considered for further processing. For instance, for a time series pertaining to a temperature sensor, motifs indicating a temperature change of less than thirty degree Celsius between any two points in the subsequence may be filtered out. For the purpose, an indicator function may be suitably defined for filtering out the subsequences failing to meet the aforementioned condition. As may be understood, the indictor function may be suitably defined and deployed depending upon the implementation where the indication function is being deployed. The filtered subsequences, i.e., the subsequences satisfying the predetermined filtering condition may then be normalized for obtaining a plurality of normalized subsequences.

In order to normalize a filtered subsequence, initially a local mean of the filtered subsequence may be computed. Thereafter, the local mean may be subtracted from the filtered subsequence for obtaining a normalized subsequence. Similarly, each of the plurality of filtered subsequences may be normalized in a similar manner for obtaining the plurality of normalized subsequences. As may be understood, as a result of normalization, a waveform occurring at different levels of magnitude throughout the plurality of filtered subsequences may be collated at a single level of magnitude. For example, a waveform pattern may be representative of two different temp states, say 20° F. and 120° F., and thus may occur at two different level of magnitude. Upon normalization, the waveform is normalized to a level where a distance measure between the two waveform patterns will result in identification of the two waveforms as similar.

The plurality of normalized subsequences may then be further processed for removing trivially matching subsequences. In one implementation, trivially matching subsequences may be removed using a technique of symbolic aggregate approximation (SAX) representation. Initially, in order to identify trivially matching subsequences, each element of a subsequence may be discretized into a symbol using SAX representation. As a result, a symbolic depiction of the subsequence may be obtained. The subsequence may then be compared with its adjacent subsequences to determine whether the symbolic depiction of the subsequence is equal to any of the adjacent subsequences. In a case where the symbolic depiction of the subsequence is equal to its adjacent subsequences, the subsequence and the adjacent subsequence are removed and are not considered for further processing. As a result of trivially matching subsequence removal, a plurality of potentially non-trivially matching subsequences, hereinafter referred to as non-trivial subsequences, is obtained. The non-trivial subsequences may then be clustered into one or more spherical clusters, where each cluster is of a predetermined radius (R).

Upon completion of clustering, spherical clusters with similar subsequences are obtained. In one implementation, each cluster for which a number of subsequences, included in the cluster, is less than a predefined threshold number is not considered for further processing. In an example, the predetermined threshold may be equal to the number of time-series which are being analyzed. While, the clusters for which a number of subsequences included in the cluster is greater than the predefined threshold number, are further processed for identifying motifs. Such clusters may also be referred to as high support clusters.

In one implementation, the high support clusters may be analyzed for identifying the frequently occurring waveform patterns. In order to identify the frequently occurring waveform pattern, shifted clusters from among the high support clusters are initially identified and removed. As will be understood, two clusters, say a first cluster (C1) and a second cluster (C2), are ascertained to be shifted clusters when p % of the subsequences included in the C1 match trivially with the subsequences of the C2. Upon identification of such shifted clusters from amongst the high support clusters, the shifted clusters are removed. Thereafter, trivially matching subsequences from each of the remaining high support clusters may be identified. In one example, the trivially matching subsequences may be identified using a two pointer algorithm. Upon identification of the trivially matching subsequences, the trivially matching subsequences are removed. The clusters of subsequences obtained after aforementioned processes are referred to as group-motifs.

Upon obtaining the group-motifs, level splitting of each of the group motif may be performed. In one example, for level splitting a group motif, a mean of each subsequence present in the group motif is computed. Subsequently, the group motif may be split using one dimensional clustering. For example, DBSCAN clustering may be used for splitting the group motif based on the mean of each subsequence present in the group motif. Thereafter, group motifs for which the number of subsequences present in the group motif is higher than predefined threshold number are ascertained to be the frequent motifs. The subsequences included in the frequent motifs depict the frequently occurring waveform pattern.

In one implementation, the frequent motifs may be ranked based on a rank of each frequent motif. In one example, the rank of a motif may be based on at least one of deviation, level, and non-trivial match count. Ranking of the final motifs enables identification of top-k frequent motifs, where k is an integer.

Thus, the present subject matter facilitates identification of frequently occurring waveform patterns in time series in an efficient manner. As a result of fixing the diameter, the diameter does not increase with increase in the number of subsequences getting clustered in a cluster. Thus, the predetermined distance, pertaining to the cluster, with which a distance between two subsequences is compared with for determination of similarity for clustering remains constant and does not increase. As a result, the possibility of non-similar subsequences getting clustered into a same cluster is reduced. Further, as will be clear from the foregoing description, some of the duplicate subsequences and trivially matching subsequences are removed at the outset, thereby improving the accuracy and computational speed of the overall process for identification of the frequent occurring waveform patterns. Furthermore, ranking of the final motifs enables identification of top final motifs, i.e., the final motifs may be obtained in a particular arrangement based on their ranks.

These and other advantages of the present subject matter would be described in greater detail in conjunction with the following figures. While aspects of described systems and methods for optimizing application resources can be implemented in any number of different computing systems, environments, and/or configurations, the embodiments are described in the context of the following device(s).

Figure 1:
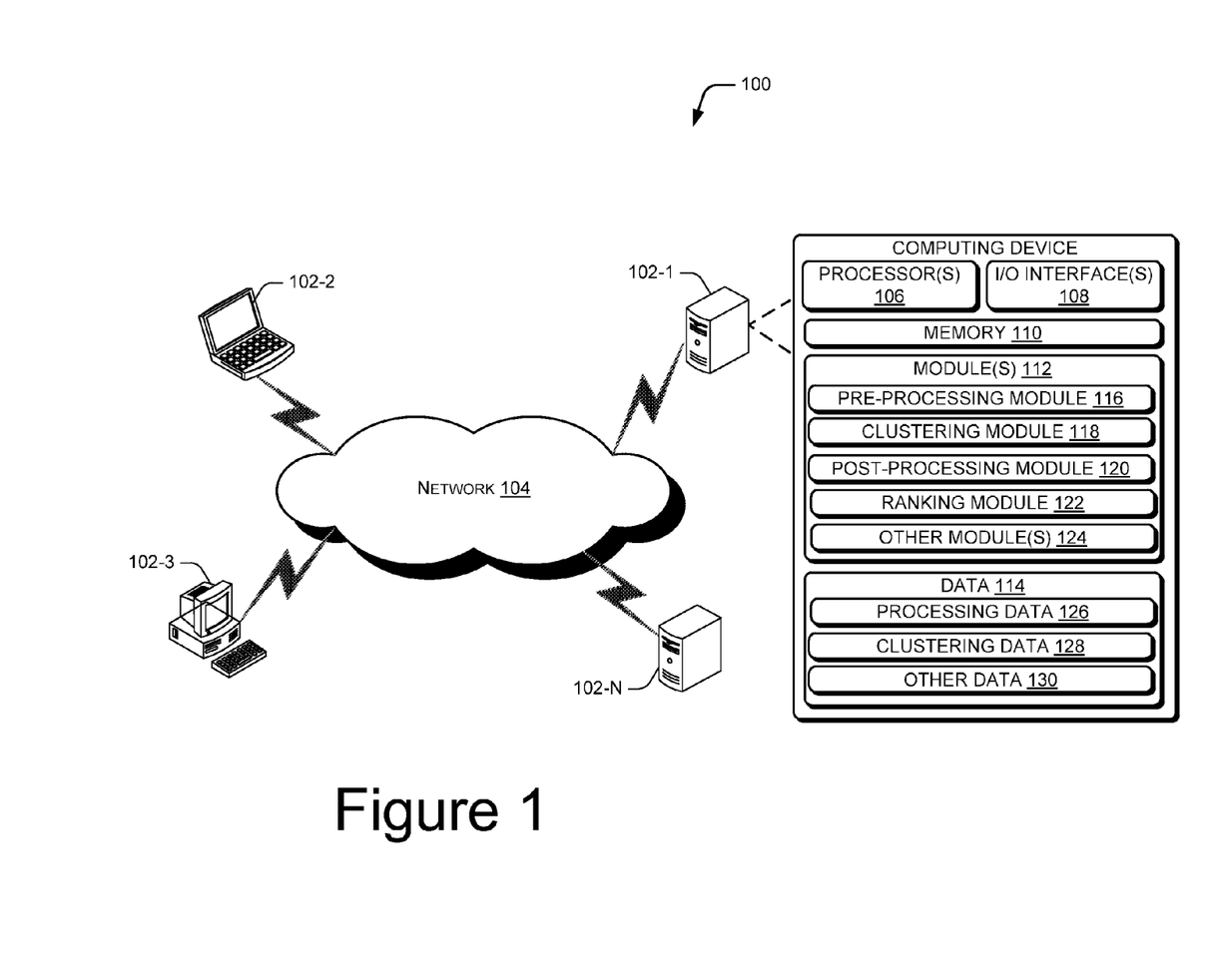
FIG. 1 illustrates a network environment implementing time series analytics, in accordance with an implementation of the present subject matter.

FIG. 1 illustrates a network environment 100 implementing time series analytics, according to an embodiment of the present subject matter. The network environment 100 includes a plurality of computing devices 102-1, 102-2, 102-3, ..., 102-N, hereinafter collectively referred to as computing devices 102 and individually referred to as a computing device 102, in communication with each other through a network 104. Communication links between the computing devices 102 are enabled through a desired form of communication, for example, via dial-up modem connections, cable links, digital subscriber lines (DSL), wireless or satellite links, or any other suitable form of communication.

In one implementation, the computing devices 102 may be implemented as one or more computing systems, such as personal computers, laptops, desktops, servers, and the like. The network 104 may be a wireless network, a wired network, or a combination thereof. The network 104 can also be an individual network or a collection of many such individual networks, interconnected with each other and functioning as a single large network, e.g., the Internet or an intranet. The network 104 can be implemented as one of the different types of networks, such as intranet, local area network (LAN), wide area network (WAN), the internet, and such. Further, the network 104 may include network devices that may interact with the computing devices 102 through communication links.

In one implementation, the computing device 102 may include one or more processor(s) 106, I/O interfaces 108, and a memory 110 coupled to the processor 106. The processor 106 can be a single processing unit or a number of units, all of which could include multiple computing units. The processor 106 may be implemented as one or more microprocessors, microcomputers, microcontrollers, digital signal processors, central processing units, state machines, logic circuitries, and/or any devices that manipulate signals based on operational instructions. Among other capabilities, the processor 106 is configured to fetch and execute computer-readable instructions and data stored in the memory 110.

The I/O interfaces 108 may include a variety of software and hardware interfaces, for example, interfaces for peripheral device(s), such as a keyboard, a mouse, a display unit, an external memory, and a printer. Further, the I/O interfaces 108 may enable the computing device 102 to communicate with other devices, such as web servers and external databases. The I/O interfaces 108 can facilitate multiple communications within a wide variety of networks and protocol types, including wired networks, for example, local area network (LAN), cable, etc., and wireless networks, such as Wireless LAN (WLAN), cellular, or satellite. For the purpose, the I/O interfaces 108 include one or more ports for connecting a number of computing systems with one another or to a network.

The memory 110 may include any non-transitory computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In one implementation, the computing device 102 also includes module(s) 112 and data 114.

The module(s) 112, amongst other things, include routines, programs, objects, components, data structures, etc., which perform particular tasks or implement data types. The module(s) 112 may also be implemented as, signal processor(s), state machine(s), logic circuitries, and/or any other device or component that manipulate signals based on operational instructions.

Further, the module(s) 112 can be implemented in hardware, instructions executed by a processing unit, or by a combination thereof. The processing unit can comprise a computer, a processor, such as the processor 106, a state machine, a logic array or any other suitable devices capable of processing instructions. The processing unit can be a general-purpose processor which executes instructions to cause the general-purpose processor to perform the required tasks or, the processing unit can be dedicated to perform the required functions.

In another aspect of the present subject matter, the module(s) 112 may be machine-readable instructions (software) which, when executed by a processor/processing unit, perform any of the described functionalities. The machine-readable instructions may be stored on an electronic memory device, hard disk, optical disk or other machine-readable storage medium or non-transitory medium. In one implementation, the machine-readable instructions can be also be downloaded to the storage medium via a network connection.

In one implementation, the module(s) 112 further includes a pre-processing module 116, a clustering module 118, a post-processing module 120, a ranking module 122, and other module(s) 124. The other modules 124 may include programs or coded instructions that supplement applications and functions of the computing device 102.

The data 114 serves, amongst other things, as a repository for storing data processed, received, and generated by one or more of the modules 112. The data 114 includes processing data 126, clustering data 128, and other data 130. The other data 130 includes data generated as a result of the execution of one or more modules in the modules 112.

In an embodiment, the computing device 102 may be implemented for performing time series analytics. The time series analytics may be understood as analysis of time series data pertaining to a time series. For instance, the computing device 102 may be deployed for identifying frequently occurring waveform patterns pertaining to one or more time series. Although the following description is with reference to plurality of time series, the principles of the present subject matter may be applicable in case of analytics of a single time series.

In one implementation, the pre-processing module 116 may segment each of the one or more time series into a plurality of subsequences. A subsequence may be understood as a segment pertaining to time series data corresponding to the time series. In one example, the pre-processing module 116 may segment the time series into subsequences of predetermined length (w) using a moving window technique. Upon segmenting the time series, the pre-processing module 116 may generate a subsequence matrix based on the one or more time series. The subsequence matrix may include the plurality of subsequences corresponding to each of the one or more time series. The pre-processing module 116 may further process the subsequence matrix for filtering and normalizing the plurality of subsequences included in the subsequence matrix.

In one implementation, the pre-processing module 116 may filter the subsequences using an indicator function ($f(\ )$) for obtaining a plurality of filtered subsequences. As will be understood, the indicator function may be based on a predetermined filtering condition. For instance, subsequences depicting waveform patterns having a slope of more than thirty degrees at any point in the subsequence may be filtered by suitably defining the indicator function. In said implementation, the pre-processing module 116 may apply the indicator function to each of the plurality of subsequence included in the subsequence matrix. Thereafter, the pre-processing 116 may obtain the subsequences, also referred to as filtered subsequences, satisfying the predetermined condition. Upon obtaining the filtered subsequences, the pre-processing module 116 may normalize the filtered subsequences for obtaining a plurality of normalized subsequences. In order to normalize a filtered subsequence, the pre-processing module 116 may initially reduce the predetermined length (w) of the subsequence to a reduced length (d) by piecewise averaging based on the filtered subsequence. For instance, the pre-processing module 116 may normalize the filtered subsequence using the following equation:

$$S_i = \frac{d}{w} \sum_{j=\frac{w}{d}(i-1)+1}^{\frac{w}{d}i} V_j \qquad (1)$$

where $S_i$ is a filtered subsequence, d is the reduced length, w is the predetermined length, and value of i varies from one to d. Thereafter, the pre-processing module 116 may subtract a local mean of the filtered subsequence from the filtered subsequence for obtaining a normalized subsequence having zero mean. The local mean may be obtained as an average of the values in a sub-sequence.

Subsequently, the pre-processing module 116 may further process the plurality of normalized subsequences for removing trivially matching subsequences. As may be understood, two subsequences are deemed to be trivially matching in a case where the two subsequences have at least one timestamp in common. Further, in another case, the two subsequences may be deemed to be trivially matching if there is no other subsequence between the two subsequences, in temporal order, such that at-least one subsequence in the middle is significantly different from the two subsequences. In one example, the pre-processing module 116 may use a known technique of SAX representation for removal of trivially matching subsequences. A trivial subsequence may be understood as a subsequence whose SAX symbolic depiction is same an SAX symbolic depiction of at least one of its adjacent subsequences. The pre-processing module 116 may initially discretize each element pertaining to the normalized subsequence into a symbol, using the technique of SAX representation, for obtaining a symbolic depiction of the normalized subsequence. The pre-processing module 116 may then compare the symbolic depiction of the normalized subsequence with its adjacent normalized subsequences. In a case the symbolic depiction matches with a symbolic depiction of at least one of the adjacent normalized subsequences, the pre-processing module 116 may remove the adjacent subsequences. Upon removing the adjacent subsequences, the pre-processing module 116 may obtain a plurality of potentially non-trivial subsequences. The non-trivial subsequences may be understood as a subsequence whose symbolic depiction does not match with an adjacent normalized subsequence. The pre-processing module 116 may store the plurality of non-trivial subsequences as a candidate subsequence matrix in the processing data 126. The candidate subsequence matrix may be further processed for clustering the non-trivial subsequences.

In one implementation, the clustering module 118 may cluster the plurality of non-trivial subsequence into a plurality of spherical clusters of predetermined diameter based on a fixed radius (R). For clustering a non-trivial subsequence, the clustering module 118 may initially identify a target spherical cluster for the non-trivial subsequence. For identifying the target spherical cluster, the clustering module 118 may initially identify a candidate cluster set. The candidate cluster set may be understood as a set of one or more spherical clusters in vicinity of the non-trivial subsequence. As will be understood, the candidate cluster set includes the target spherical cluster of the non-trivial subsequence. In one example, the clustering module 118 may use a clustering technique for identifying the candidate cluster set. Examples of the clustering techniques include, but are not limited to, a binary search tree (BST) acceleration, a local-sensitive hashing (LSH) acceleration, and a balanced iterative reducing and clustering using hierarchies (BIRCH) acceleration. Thereafter, the clustering module 118 may compute a cluster distance for each of the spherical clusters present in the candidate cluster set. The cluster distance may be understood as a distance between a subsequence which is to be clustered and a centroid of a cluster included in a candidate cluster set of the subsequence. Upon computing the candidate cluster for each of the spherical clusters present in the candidate cluster set, the clustering module 118 may identify a vicinity cluster based on the cluster distance. The vicinity cluster may be understood as a spherical cluster having the lowest candidate cluster distance from among the candidate cluster set. Thereafter, the clustering module 118 may compare the cluster distance of the vicinity cluster with the predetermined radius. In a case where the cluster distance of the vicinity cluster is less than the predetermined radius, the clustering module 118 ascertains the vicinity cluster to be the target spherical cluster. Thereafter, the clustering module 118 may cluster the non-trivial subsequence in the target spherical cluster. Further, the clustering module 118 may update the centroid of the target spherical cluster. In a case where the cluster distance of the vicinity cluster is more than the predetermined radius, the clustering module 118 may create a new cluster and cluster the non-trivial subsequence in the new cluster. The clustering module 118 may store the plurality of spherical clusters in the clustering data 128.

Upon clustering of the non-trivial subsequences into the spherical clusters, the spherical clusters may be further processed for obtaining the frequently occurring waveform patterns. In one implementation, the post-processing module 120 may obtain the spherical clusters stored in the clustering data 128 for further processing. The post processing module 120 may initially identify one or more high support clusters from the plurality of spherical clusters. The high support cluster may be understood as a spherical cluster for which a number of non-trivial subsequences included in the spherical cluster is more than or equal to a predefined threshold number. In an example, the predefined threshold number may be equal to a number of the time series which are being analyzed. Thereafter, the post processing module 120 may identify one or more pairs of shifted clusters from amongst the high support clusters. As will be understood, two high support clusters, say a first high support cluster (C1) and a second high support cluster (C2), are ascertained to be as shifted clusters in a case where a predetermined percentage of a number of non-trivial subsequences of C1 overlap with a number of non-trivial subsequences of the C2. In such a case, the post processing module 120 may remove the high support cluster with the lower number of subsequences from amongst the C1 and the C2. Thereafter, the post processing module 120 may process the remaining high support clusters for removing the trivially matching subsequences present in the high support clusters for obtaining one or more spherical clusters, also referred to as group motifs. As described, the one or more group motifs do not include any shifted clusters and trivially matching subsequences.

The post processing module 120 may then further process each of the one or more spherical clusters for obtaining the frequently occurring waveform patterns. In one implementation, the post processing module 120 may initially compute a mean for each non-trivial subsequence present in the spherical cluster. The computed mean may also be referred to as level. For instance, the post processing module 120 may compute the mean using the following equation:

$$L(Si) = \frac{1}{w}\sum_{j=0}^{w} S_i^{-j} \quad (2)$$

where L is the mean, $S_i$ is the non-trivial subsequence, and w is the predetermined length.

Thereafter, the post processing module 120 may use a one-dimensional clustering technique for clustering the subsequences present in the spherical cluster into a plurality of sub-clusters. In one example, the post processing module 120 may use DBSCAN clustering for obtaining the sub-clusters from the spherical clusters.

Upon obtaining the sub-clusters, the post processing module 120 may ascertain one or more frequent waveform clusters from amongst the one or more spherical clusters. In one example, the post processing module 120 may ascertain the frequent waveform clusters based on a number of subsequences in each of the sub-clusters included in the spherical clusters. In said example, in a case where the number of subsequences included in a sub-cluster of the spherical cluster is more than or equal to the predefined threshold number, the post processing module 120 may ascertain the sub-cluster of the spherical cluster to be a frequent waveform cluster. In another case, where the number of subsequences included in a sub-cluster of the spherical cluster is less than the predefined threshold number, the post processing module 120 may discard the sub-cluster of the spherical cluster. The post processing module 120 may then store the frequent waveform clusters in the processing data 126. The frequent waveform cluster obtained depicts frequently occurring waveform patterns.

The frequent waveform clusters obtained may be ranked for identifying top-k clusters, where k is an integer. In one implementation, the ranking module 122 may rank the frequent waveform clusters using a predetermined ranking function. In one example, the ranking function may be based on based on at least one of a deviation (A) of the frequent waveform cluster, a level (l) of the frequent waveform cluster, and a non-trivial match count ($|M_i|$) of the frequent waveform cluster. The deviation may be understood as an average deviation of the non-trivial subsequences pertaining to the frequent waveform cluster. The level of the frequent waveform cluster may be understood as an average of the means of each of the non-trivial subsequence pertaining to the frequent waveform cluster. Further, the non-trivial match count may be understood as a number of the non-trivial subsequences present in the frequent waveform cluster.

Upon computing the rank for the frequent waveform clusters, the post processing module 120 may arrange the frequent waveform clusters based on their respective ranks. For instance, the post processing module 120 may arrange the frequent waveform cluster in an increasing order or a decreasing order based on the ranks of the frequent waveform clusters.

Figure 2:
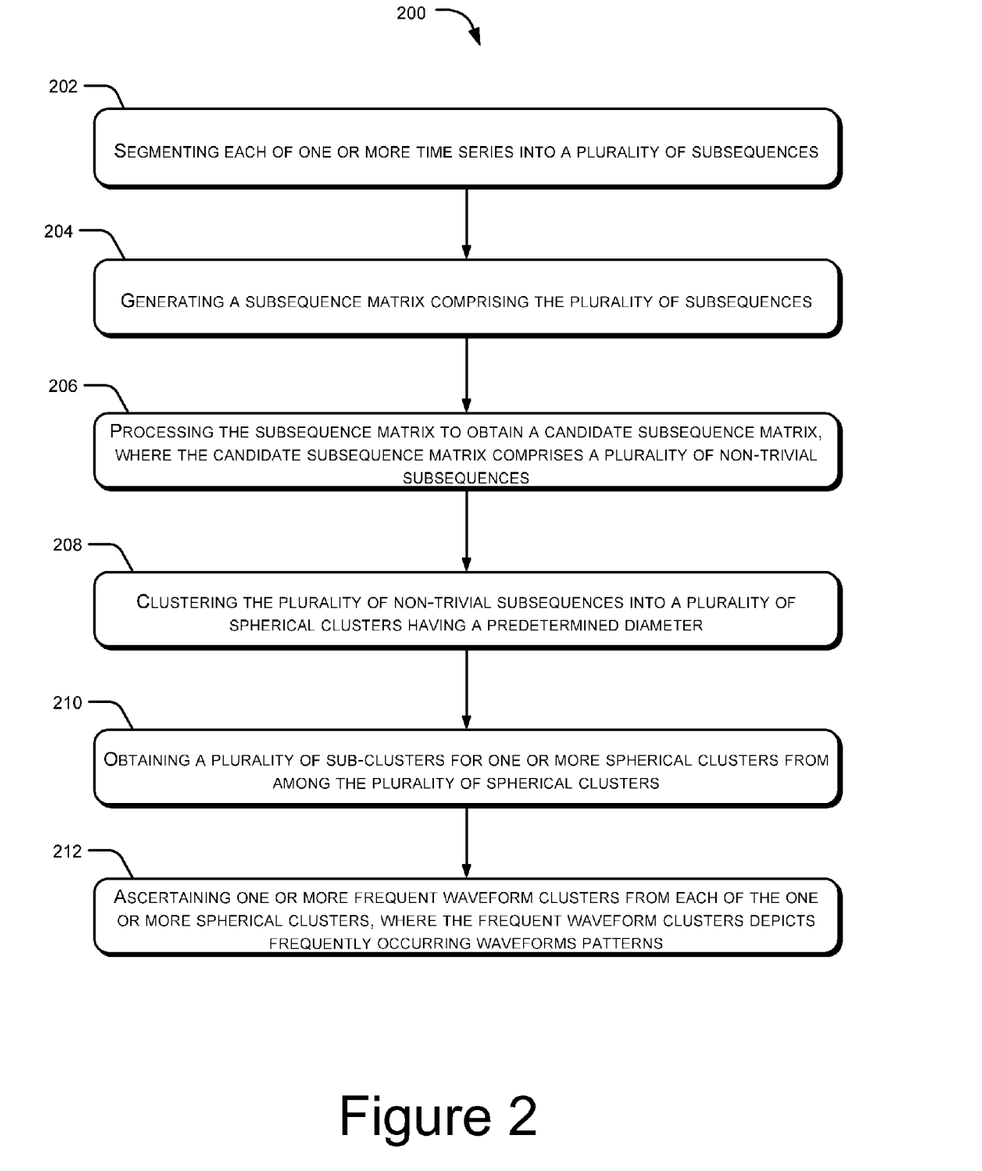
FIG. 2 illustrates a method for identifying frequently occurring waveform patterns in time series, in accordance with an implementation of the present subject matter.

FIG. 2 illustrates a method 200 for identifying frequently occurring waveform patterns in time series, according to an embodiment of the present subject matter. The method 200 may be implemented in a variety of computing systems in several different ways. For example, the method 200, described herein, may be implemented using the computing device 102, as described above.

The method 200, completely or partially, may be described in the general context of computer executable instructions. Generally, computer executable instructions can include routines, programs, objects, components, data structures, procedures, modules, functions, etc., that perform particular functions or implement particular abstract data types. A person skilled in the art will readily recognize that steps of the method can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of the described method 200.

The order in which the method 200 is described is not intended to be construed as a limitation, and any number of the described method blocks can be combined in any order to implement the method, or an alternative method. Additionally, individual blocks may be deleted from the method without departing from the spirit and scope of the subject matter described herein. Furthermore, the methods can be implemented in any suitable hardware, software, firmware, or combination thereof. It will be understood that even though the method 200 is described with reference to the computing device 102, the description may be extended to other systems as well.

With reference to the description of FIG. 2, for the sake of brevity, the details of the components of the computing device 102 are not discussed here. Such details can be understood as provided in the description provided with reference to FIG. 1.

At block 202, each of one or more time series are segmented into a plurality of subsequences. In one implementation, each time series may be segmented into a plurality of subsequences using a moving window of predetermined length. A subsequence may be understood as a segment of predetermined length pertaining to time series data corresponding to the time series. In one example, the pre-processing module 116 may segment the time series into the plurality of subsequences.

At block 204, a subsequence matrix comprising the plurality of subsequences is generated. In one implementation, the pre-processing module 116 may generate the subsequence matrix based on the segmentation. The subsequence matrix may comprise the plurality of subsequence corresponding to each of the time series.

At block 206, the subsequence matrix may be processed to obtain a candidate subsequence matrix. Upon generating the subsequence matrix, the plurality of subsequences in the subsequence matrix may initially be filtered using an indicator function for obtaining a plurality of filtered subsequences. Thereafter, the filtered subsequences may be normalized for obtaining a plurality of normalized subsequences. Subsequently, trivially matching subsequences may be removed from the normalized subsequences using a known technique of SAX representation for obtaining a plurality of non-trivial subsequences.

At block 208, the plurality of non-trivial subsequences is clustered into a plurality of spherical clusters having a predetermined diameter. In one implementation, the non-trivial subsequences may be clustered into spherical clusters having a predetermined diameter which in turn is based on a fixed radius (R). Initially a candidate cluster set may be indentified for the non-trivial subsequence using a clustering technique, for example, BST acceleration, LSH acceleration, and BIRCH acceleration. Thereafter, a vicinity spherical cluster may be identified from the candidate cluster set. In a case where a cluster distance of the vicinity spherical cluster is less than the predetermined radius, the non-trivial subsequence may be clustered into the vicinity spherical cluster. In a case where the cluster distance of the vicinity spherical cluster is more than the predetermined radius, the non-trivial subsequence may be clustered in a new spherical cluster. In one example, the clustering module 118 may cluster the non-trivial subsequences in the spherical clusters.

At block 210, a plurality of sub-clusters for one or more spherical clusters, from among the plurality of spherical clusters, are obtained. In one example, the spherical clusters may be further processed for identifying one or more high support clusters. Thereafter, shifted clusters from among the high support clusters may be identified and removed. Upon removal of the shifted clusters, trivially matching subsequences from the remaining high support clusters may be removed for obtaining the one or more spherical clusters. Thereafter, each of the one or more spherical clusters may be further processed. For example, the spherical cluster may be further clustered based on a mean of each of the non-trivial subsequences in the spherical cluster. In one example, one dimensional clustering technique, such as DBSCAN clustering, may be used. As a result of clustering, the plurality of sub-clusters is obtained. In one implementation, the post processing module 120 may obtain the plurality of sub-clusters for each of the one or more spherical clusters.

At block 212, one or more frequent waveform clusters are ascertained from the one or more spherical clusters. In one example, the frequent waveform clusters may be ascertained based on a number of subsequences in each of the sub-clusters of the spherical cluster. In a case where the number of subsequence in a sub-cluster of the spherical cluster is more than a predefined threshold number, the sub-cluster is ascertained to be a frequent waveform cluster. In another case, where the number of subsequence in a sub-cluster of the spherical cluster is less than the predefined threshold number, the sub-cluster may be discarded. In an example, the predefined threshold number may be equal to a number of the time series being analyzed. The ascertained frequent waveform clusters depicts frequently occurring waveform patterns.

The frequent waveform clusters obtained may be further ranked using a ranking function. In one example, the ranking function may be based on at least one of a deviation of the frequent waveform cluster, a level of the frequent waveform cluster, and a non-trivial match count of the frequent waveform cluster. The ranking of the frequent waveform cluster facilitates in identifying top frequently occurring waveform pattern.

Although implementations for methods and systems for identifying frequently occurring waveform patterns are described, it is to be understood that the present subject matter is not necessarily limited to the specific features or methods described. Rather, the specific features and methods are disclosed as implementations for identifying frequently occurring waveform patterns.

We claim:
1. A computer-implemented method for identifying frequently occurring waveform patterns in time series, the method comprising:
  segmenting each of one or more time series into a plurality of subsequences, wherein each of the plurality of subsequences is a segment of a predetermined length pertaining to time series data corresponding to the time series;
  obtaining a candidate subsequence matrix, comprising a plurality of non-trivial subsequences, wherein each of the non-trivial subsequence is a subsequence having unique symbolic aggregate approximation (SAX) symbolic representation in comparison to adjacent non-trivial subsequences;
  processing the candidate subsequence matrix for filtering and normalizing the plurality of non-trivial subsequences included in the subsequence matrix;
  clustering the plurality of normalized non-trivial subsequences into a plurality of spherical clusters, wherein each of the plurality of spherical clusters is of a predetermined diameter based on a fixed radius, wherein clustering the plurality of normalized non-trivial subsequences comprises the steps of:
    ascertaining, for each of the plurality of non-trivial subsequences, a candidate cluster set based on a clustering technique, wherein the candidate cluster set comprises one or more spherical clusters in vicinity of the non-trivial subsequence and wherein the clustering technique is one of a binary search tree (BST) acceleration, a local-sensitive hashing (LSH) acceleration, and a balanced iterative reducing and clustering using hierarchies (BIRCH) acceleration;
    computing a cluster distance for each of the one or more spherical clusters pertaining to the candidate cluster set, wherein the cluster distance is a distance between the non-trivial subsequence and a centroid of the spherical cluster;
    identifying a vicinity spherical cluster, from among the one or more spherical clusters, wherein the vicinity spherical cluster is a cluster having lowest value of cluster distance;
    comparing the cluster distance of the vicinity spherical cluster with a predetermined threshold distance, wherein the predetermined threshold distance is equal to the predetermined radius; and
    including the non-trivial subsequence in the vicinity spherical cluster based on the comparison;
  obtaining a plurality of sub-clusters for each of one or more spherical clusters, from among the plurality of spherical clusters, based on a mean of each of the plurality of non-trivial subsequences present in the spherical cluster, wherein each of the plurality of sub-clusters includes one or more non-trivial subsequences from amongst the plurality of non-trivial subsequences; and ascertaining, one or more frequent waveform clusters, from each of the one or more spherical clusters based on a number of non-trivial subsequences present in each of the plurality of sub-clusters of the spherical cluster, wherein a frequent waveform cluster has a number of non-trivial subsequences greater than a predefined threshold number, and wherein the non-trivial subsequences depict frequently occurring waveform patterns.

2. The method as claimed in claim 1, wherein the obtaining further comprises:

generating a subsequence matrix based on the segmenting, wherein the subsequence matrix comprises each of the plurality of subsequences; and processing the subsequence matrix to obtain the candidate subsequence matrix.

3. The method as claimed in claim 2, wherein the processing further comprises:

filtering the plurality of subsequences using an indicator function for obtaining a plurality of filtered subsequences, wherein each of the plurality of filtered subsequences satisfies a predetermined filtering condition depicted by the indicator function;

reducing the predetermined length of each of the plurality of filtered subsequences to a reduced length using piecewise averaging of the filtered subsequences;

computing a local mean for each of the plurality of filtered subsequences of reduced length; and subtracting, for each of the plurality of filtered subsequences of reduced length, the local mean from the filtered subsequence to obtain a plurality of normalized subsequences, wherein a normalized subsequence is a subsequence having a zero mean;

discretizing, for each of the plurality of normalized subsequences, each element pertaining to the normalized subsequence into a symbol using the SAX representation for obtaining a symbolic depiction of the normalized subsequence; and identifying, from among the discretized plurality of normalized subsequences, at least one non-trivial subsequence, wherein the non-trivial subsequence is a subsequence whose symbolic depiction does not match with a symbolic depiction of an adjacent subsequence.

4. The method as claimed in claim 1, wherein the clustering further comprises:

ascertaining, for the cluster distance of the vicinity spherical cluster being less than the predetermined threshold distance, the vicinity spherical cluster as a target spherical cluster; and including the non-trivial subsequence in the target spherical cluster.

5. The method as claimed in claim 1, wherein the clustering further comprises:

creating, for the cluster distance of the vicinity spherical cluster being more than the predetermined threshold, a new cluster; and including the non-trivial subsequence in the new cluster.

6. The method as claimed in claim 1, wherein the candidate cluster set is ascertained based on at least one of a binary search tree (BST) acceleration technique, a locally sensitive hashing (LSH) acceleration technique, and a BIRCH acceleration technique.

7. The method as claimed in claim 1, wherein each of the plurality of non-trivial subsequences present in the spherical cluster are clustered into sub-clusters using one-dimensional clustering techniques.

8. The method as claimed in claim 1, wherein the method further comprises:

identifying, from amongst the plurality of spherical clusters, one or more high support spherical clusters, wherein each of the one or more high support spherical clusters is a spherical cluster having a number of subsequences greater than the predefined threshold number;

identifying one or more pairs of shifted spherical clusters from among the identified high support clusters, wherein a predetermined percentage of non-trivial subsequences of a first high support spherical cluster present in a pair of shifted spherical clusters is similar to the non-trivial subsequences of a second high support spherical cluster present in the pair of shifted spherical cluster, and wherein the number of non-trivial subsequence in the first high support cluster is less than the number of non-trivial subsequences in the second high support cluster; and obtaining the second high support clusters from the one or more pairs of shifted clusters; and processing each of the high support clusters to remove trivial match subsequences present in the high support cluster for obtaining the one or more spherical clusters pertaining to the plurality of spherical clusters.

9. The method as claimed in claim 1, wherein the method further comprises:

computing a rank for each of the one or more frequent waveform clusters using a ranking function, wherein the ranking function is based on at least one of a deviation of the frequent waveform cluster, a level of the frequent waveform cluster, and a non-trivial match count pertaining to the frequent waveform cluster, wherein the deviation is a an average deviation of the non-trivial subsequences pertaining to the frequent waveform cluster, the level of the frequent waveform cluster is an average of the means of each of the non-trivial subsequence pertaining to the frequent waveform cluster, and the non-trivial match count is a number of the non-trivial subsequences present in the frequent waveform cluster; and arranging the one or more frequent waveform clusters based on the rank of each of the one or more frequent waveform clusters.

10. A computing device comprising:

a processor;

a memory coupled to the processor, wherein the memory comprises:

a pre-processing module that, segments each of one or more time series into a plurality of subsequences, wherein each of the plurality of subsequences is a segment of a predetermined length pertaining to time series data corresponding to the time series;

obtains a candidate subsequence matrix, wherein the candidate subsequence matrix comprises a plurality of non-trivial subsequences, wherein each of the non-trivial subsequence is a subsequence having unique symbolic aggregate approximation (SAX) symbolic representation in comparison to adjacent non-trivial subsequences; and processes the candidate subsequence matrix for filtering and normalizing the plurality of non-trivial subsequences included in the subsequence matrix;

a clustering module to, cluster the plurality of normalized non-trivial subsequences into a plurality of spherical clusters, wherein each of the plurality of spherical clusters is of a predetermined diameter based on a fixed radius, and wherein a maximum distance between a first non-trivial subsequence and a second non-trivial subsequence present in the spherical cluster is less than or equal to the predetermined diameter, wherein to cluster the plurality of normalized non-trivial subsequences, the clustering module to:

ascertain, for each of the plurality of non-trivial subsequences, a candidate cluster set based on a clustering technique, wherein the candidate cluster set comprises one or more spherical clusters in vicinity of the non-trivial subsequence and wherein the clustering technique is one of a binary search tree (BST) acceleration, a local-sensitive hashing (LSH) acceleration, and a balanced iterative reducing and clustering using hierarchies (BIRCH) acceleration;

compute a cluster distance for each of the one or more spherical clusters pertaining to the candidate cluster set, wherein the cluster distance is a distance between the non-trivial subsequence and a centroid of the spherical cluster;

identify a vicinity spherical cluster, from among the one or more spherical clusters, wherein the vicinity spherical cluster is a cluster having lowest value of cluster distance;

compare the cluster distance of the vicinity spherical cluster with a predetermined threshold distance, wherein the predetermined threshold distance is equal to the predetermined radius; and include the non-trivial subsequence in the vicinity spherical cluster based on the comparison; and a post-processing module to, obtain a plurality of sub-clusters for one or more spherical clusters from among the plurality of spherical clusters based on a mean of each of the plurality of non-trivial subsequences present in the spherical cluster, wherein each of the plurality of sub-clusters includes one or more non-trivial subsequences from amongst the plurality of non-trivial subsequences; and ascertain, one or more frequent waveform clusters, from each of the one or more spherical clusters based on a number of non-trivial subsequences present in each of the plurality of sub-clusters of the spherical cluster, wherein a frequent waveform cluster has a number of non-trivial subsequences greater than a predefined threshold number, and wherein the non-trivial subsequences depict frequently occurring waveform patterns.

11. The computing device as claimed in claim 10, wherein the pre-processing module further, generates a subsequence matrix based on the segmenting, wherein the subsequence matrix comprises each of the plurality of subsequences;

filters the plurality of using an indicator function for obtaining a plurality of filtered subsequences, wherein each of the plurality of filtered subsequences satisfies a predetermined filtering condition depicted by the indicator function;

reduces the predetermined length of each of the plurality of filtered subsequences to a reduced length using piecewise averaging of the filtered subsequences;

computes a local mean for each of the plurality of filtered subsequences of reduced length; and subtracts, for each of the plurality of filtered subsequences of reduced length, the local mean from the filtered subsequence to obtain a plurality of normalized subsequences, wherein a normalized subsequence is a subsequence having a zero mean;

discretizes, for each of the plurality of normalized subsequences, each element pertaining to the normalized subsequence into a symbol using the SAX representation for obtaining a symbolic depiction of the normalized subsequence; and identifies, from among the discretized plurality of normalized subsequences, at least one non-trivial subsequence, wherein the non-trivial subsequence is a subsequence whose symbolic depiction does not match with a symbolic depiction of an adjacent subsequence.

12. The computing device as claimed in claim 10, wherein the clustering module further, ascertains, for the cluster distance of the vicinity spherical cluster being less than the predetermined threshold distance, the vicinity spherical cluster as a target spherical cluster; and clusters the non-trivial subsequence in the target spherical cluster.

13. The computing device as claimed in claim 10, wherein the clustering module further, creates, for the cluster distance of the vicinity spherical cluster being more than the predetermined threshold, a new cluster; and clusters the non-trivial subsequence in the new cluster.

14. The computing device as claimed in claim 10, wherein the post processing module further, identifies, from amongst the plurality of spherical clusters, one or more high support spherical clusters, wherein each of the one or more high support spherical clusters is a spherical cluster whose number of subsequences is greater than a number of the one or more time series;

identifies one or more pairs of shifted spherical clusters from among the identified high support clusters, wherein a predetermined percentage of non-trivial subsequences of a first high support spherical cluster present in a pair of shifted spherical clusters is similar to the non-trivial subsequences of a second high support spherical cluster present in the pair of shifted spherical cluster, and wherein the number of non-trivial subsequence in the first high support cluster is less than the number of non-trivial subsequences in the second high support cluster; and obtains the second high support clusters from the one or more pairs of shifted clusters; and processes each of the high support clusters to remove trivial match subsequences present in the high support cluster for obtaining the one or more spherical clusters pertaining to the plurality of spherical clusters.

15. The computing device as claimed in claim 10, wherein the computing device further comprises a ranking module coupled to the processor to, computes a rank for each of the one or more frequent waveform clusters using a ranking function, wherein the ranking function is based on at least one of a deviation of the frequent waveform cluster, a level of the frequent waveform cluster, and a non-trivial match count pertaining to the frequent waveform cluster, wherein the deviation is a an average deviation of the non-trivial subsequences pertaining to the frequent waveform cluster, the level of the frequent waveform cluster is an average of the means of each of the non-trivial subsequence pertaining to the frequent waveform cluster, and the non-trivial match count is a number of the non-trivial subsequences present in the frequent waveform cluster; and arranges the one or more frequent waveform clusters based on the rank of each of the one or more frequent waveform clusters.

16. A non-transitory computer-readable medium having embodied thereon a computer program for executing a method comprising:

segmenting each of one or more time series into a plurality of subsequences, wherein each of the plurality of subsequences is a segment of a predetermined length pertaining to time series data corresponding to the time series;

obtaining a candidate subsequence matrix, wherein the candidate subsequence matrix comprises a plurality of non-trivial subsequences, wherein each of the non-trivial subsequence is a subsequence having unique symbolic aggregate approximation (SAX) symbolic representation in comparison to adjacent non-trivial subsequences;

processing the candidate subsequence matrix for filtering and normalizing the plurality of non-trivial subsequences included in the subsequence matrix;

clustering the plurality of normalized non-trivial subsequences into a plurality of spherical clusters, wherein each of the plurality of spherical clusters is of a predetermined diameter based on a fixed radius, wherein clustering the plurality of normalized non-trivial subsequences comprises the steps of:

ascertaining, for each of the plurality of non-trivial subsequences, a candidate cluster set based on a clustering technique, wherein the candidate cluster set comprises one or more spherical clusters in vicinity of the non-trivial subsequence and wherein the clustering technique is one of a binary search tree (BST) acceleration, a local-sensitive hashing (LSH) acceleration, and a balanced iterative reducing and clustering using hierarchies (BIRCH) acceleration;

computing a cluster distance for each of the one or more spherical clusters pertaining to the candidate cluster set, wherein the cluster distance is a distance between the non-trivial subsequence and a centroid of the spherical cluster;

identifying a vicinity spherical cluster, from among the one or more spherical clusters, wherein the vicinity spherical cluster is a cluster having lowest value of cluster distance;

comparing the cluster distance of the vicinity spherical cluster with a predetermined threshold distance, wherein the predetermined threshold distance is equal to the predetermined radius; and including the non-trivial subsequence in the vicinity spherical cluster based on the comparison;

obtaining a plurality of sub-clusters for one or more spherical clusters from among the plurality of spherical clusters based on a mean of each of the plurality of non-trivial subsequences present in the spherical cluster, wherein each of the plurality of sub-clusters includes one or more non-trivial subsequences from amongst the plurality of non-trivial subsequences; and ascertaining, one or more frequent waveform clusters, from each of the one or more spherical clusters based on a number of non-trivial subsequences present in each of the plurality of sub-clusters of the spherical cluster, wherein a frequent waveform cluster has a number of non-trivial subsequences greater than a predefined threshold number, and wherein the non-trivial subsequences depict frequently occurring waveform patterns.

* * * * *